United States Patent [19]

Arii et al.

[11] 4,120,019
[45] Oct. 10, 1978

[54] APPARATUS FOR COOLING ELECTRICAL COMPONENTS

[75] Inventors: Hiroshi Arii, Kawasaki; Hirohito Kawada, Mitaka; Takashi Yoshida; Chiaki Nonaka, both of Tokyo, all of Japan

[73] Assignee: Sony Corporation, Tokyo, Japan

[21] Appl. No.: 766,379

[22] Filed: Feb. 7, 1977

[30] Foreign Application Priority Data

Feb. 14, 1976 [JP] Japan .............................. 51-16469[U]

[51] Int. Cl.² ............................................. H05K 7/20
[52] U.S. Cl. .............................. 361/385; 174/15 HP; 361/381; 357/82
[58] Field of Search ........................ 165/12 Q, 12 D; 361/381, 385, 386, 388; 357/81, 82; 174/15 HP

[56] References Cited

U.S. PATENT DOCUMENTS

| | | | |
|---|---|---|---|
| 3,143,592 | 8/1964 | August | 361/385 |
| 3,475,657 | 10/1969 | Knowles | 361/381 |
| 3,515,949 | 6/1970 | Michaels | 361/381 |
| 3,852,806 | 12/1974 | Corman | 174/15 HP |

OTHER PUBLICATIONS

Conduction Cooled Heat Plate, IBM Tech. Discl. Bulletin, Dombrowskas, vol. 13, No. 2, 7/70, p. 442.

*Primary Examiner*—Gerald P. Tolin
*Attorney, Agent, or Firm*—Hill, Gross, Simpson, Van Santen, Steadman, Chiara & Simpson

[57] ABSTRACT

In a cooling assembly including a heat conductive block mounting an electronic part, and a heat pipe attached to the heat conductive block, a connector connected to the leads of the electronic part is arranged in the heat conductive block.

8 Claims, 11 Drawing Figures

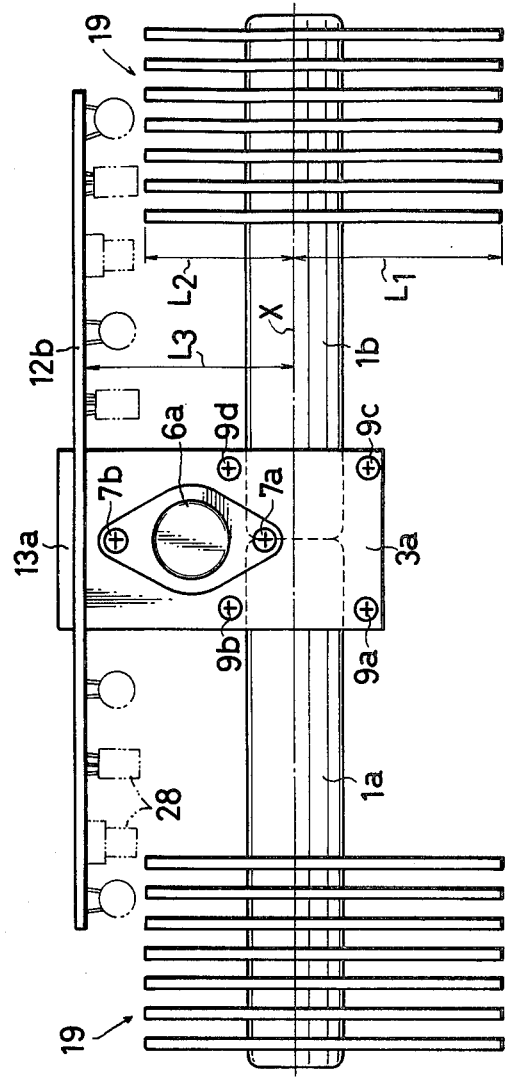

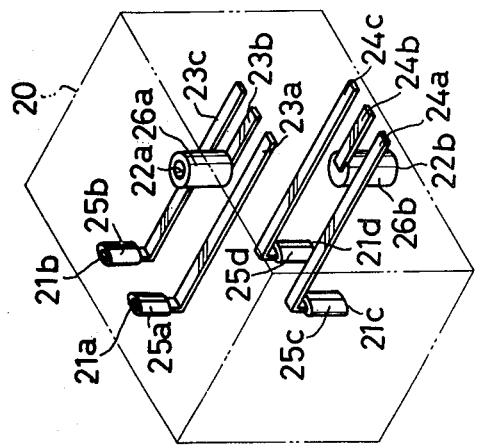
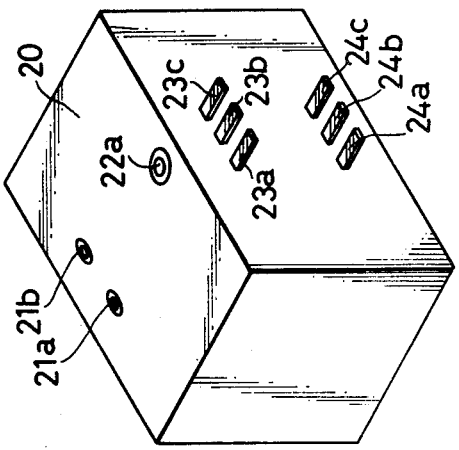

APPARATUS FOR COOLING ELECTRICAL COMPONENTS

BACKGROUND OF THE INVENTION

1. Field of the Invention

This invention relates to a cooling assembly for electric parts, and more particularly to an improved cooling assembly for electric parts.

2. Description of the Prior Art

Generally, high power semiconductor elements such as power transistors and diodes are used as circuit elements in acoustic apparatus such as stereo amplifiers and television receivers, or in electronic apparatus such as transmitters, measuring apparatus and rectifiers. Most of the consumed power is converted into thermal energy in the high power semiconductor elements. There is the possibility that the high power semiconductor elements will be heated up and damaged. Accordingly, a cooling apparatus is provided for the high power semiconductor element for radiating heat outwards from the high power semiconductor element. Generally, a heat sink having fins, made of aluminium is used as the cooling apparatus. However, the distance between the fins of the heat sink and the heat-generating element is a long distance, and the thermal resistance of the cooling system is high. Accordingly, a satisfactory cooling effect cannot be obtained by the heat sink. The heat sink having fins is relatively large. The space occupied by the heat sink is relatively large in the electronic apparatus which is undesirable.

Recently, a heat pipe has been used as a heat transfer means for heat radiation for an electronic apparatus. The heat transfer means for heat radiation comprises a closed cylindrical pipe made of copper with closed ends. The inner wall of the pipe is lined with netted wicking material impregnated with working fluid (for example, water) as a heat conveying medium. The interior of the pipe is decompressed so that the working fluid can be easily vaporized.

The heat pipe consists of a vaporizing portion, an adiabatic portion and a condensing portion. When heat input power is supplied to the vaporizing portion of the heat pipe from the semiconductor element, the working liquid in the vaporizing portion is supplied heat of vaporization and vaporizes. The vapor pressure of the vaporizing portion increases with the vaporization of the working liquid. The vapor flows to the adiabatic portion of lower vapor pressure from the vaporizing portion, and then it reaches the condensing portion through the adiabatic portion. In the condensing portion, the vapor is cooled and condensed to radiate heat of liquefaction. With the movement of the vapor which has obtained heat of vaporization, heat from the semiconductor element as a heat-generator is transferred in the axial direction of the heat pipe. Thus, heat is radiated outward from the semiconductor element.

The amount of the working liquid in the vaporizing portion is smaller than the amount of the working liquid in the condensing portion, since the working liquid is always vaporized in the vaporizing portion and the working liquid is always condensed in the condensing portion. Accordingly, the capillary pressure in the condensing portion is higher than the capillary pressure in the vaporizing portion. Due to the capillary action of the wicking material, the working liquid is transported from the condensing portion to the vaporizing portion. The working liquid is continuously vaporized and condensed nearly at the same temperature, respectively. The temperature gradient of the heat pipe is very small over the whole length of the heat pipe in the stationary state. A large amount of heat is transferred. The thermal conductivity of the heat pipe is high, or the thermal resistivity is low.

For cooling, the semiconductor element is attached to a mounting plate or a polygonal metal block fixed directly to the vaporizing portion of the heat pipe by welding or the like. After lead-wires are connected to the semiconductor element thus attached, the semiconductor element must be accompanied by the heat pipe when the semiconductor element is to be moved from one place to another. Or whenever the semiconductor element is to be moved, the lead wires must be disconnected from the semiconductor element. When the heat pipe or cooling fins attached to the heat pipe are large it is very troublesome to move the semiconductor element. When the semiconductor element is attached to the metal block, the lead wires must be detoured, and cannot be connected directly to a printed circuit board.

Although the heat pipe is superior in thermal conductivity, the thermal conductivity is lowered with the reduction of the diameter of the heat pipe and with the length of the latter. It is troublesome to handle the long heat pipe. There are thus various problems relating to the heat pipe.

As understood from the above description relative to the operation, it is not easy to cut the heat pipe to a required length for use. Accordingly, it is required that the length of the heat pipe be standarized for any case.

SUMMARY OF THE INVENTION

An object of this invention is to provide a cooling assembly which is small-sized and superior in heat radiation effect.

Another object of this invention is to provide a cooling assembly in which leads of an electronic part can be efficiently connected to a printed circuit board.

A further object of this invention is to provide a cooling assembly in which a heat pipe that is standardized in size can be effectively utilized.

A still further object of this invention is to provide a cooling assembly in which electronic parts, a heat-conductive block and a heat pipe can be very easily mounted.

A still further object of this invention is to provide a cooling assembly in which a connector is arranged in the heat-conductive block to hold the heat pipe, whereby the leads of the electronic part can be easily connected to the printed circuit board.

A still further object of this invention is to provide a cooling assembly in which the heat pipe and radiating fins are attached eccentrically to each other and thereby can be applied to printed circuit boards of various sizes.

According to an aspect of this invention, a cooling assembly including a heat generating electric part having leads, a heat conductive block mounting the heat generating electric part, and a heat pipe attached to the heat conductive block for radiating the heat from the heat generating electric part to the air through the heat conductive block are combined. The heat conductive block comprises a thickened portion to be combined with the heat pipe, and a thinned portion formed contiguously to the thickened portion. The heat generating electric part is mounted on the heat conductive block so that at least one part of the heat generating electric part extends on the outer surface of the thinned portion, and a connector is arranged on the inner surface of the thinned portion to be connected to the leads of the heat generating electric part.

The above, and other objects, features and advantages of this invention, will be apparent in the following detailed description of an illustrative embodiment which is to be read in connection with the accompanying drawings.

BRIEF DESCRIPTION OF THE DRAWINGS

FIG. 7 and FIG. 9 are plan views of a cooling assembly according to a fourth embodiment of this invention, which are different from each other in the relative position of the heat pipe having cooling fins to the heat-conductive block;

FIG. 10A and FIG. 10B are perspective views of one modification of a connector to be used for the cooling assembly according to this invention, and FIG. 10B shows the internal of the connector.

DESCRIPTION OF THE PREFERRED EMBODIMENTS

For a better understanding of this invention, the well known heat pipe, which is used for a cooling assembly of this invention, will be described with reference to FIG. 1.

Figure 1:
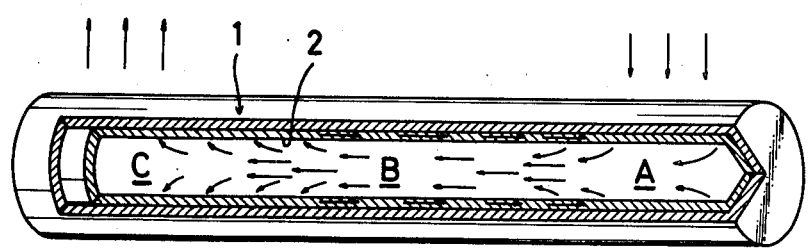
FIG. 1 is a perspective view of a well known heat pipe, partly broken away.

In FIG. 1, the inner wall of a closed cylindrical pipe 1 is lined with netted wicking material 2 and impregnated with working liquid (for example, water) as a heat medium. The interior of the pipe 1 is decompressed so that the working liquid can be easily vaporized.

The heat pipe consists of a vaporizing portion A, an adiabatic portion B and a condensing portion C. When heat input power is supplied to the vaporizing portion A from a semiconductor element, the working liquid in the vaporizing portion A obtains heat of vaporization and vaporizes. The vapor pressure in the vaporizing portion A increases with the vaporization of the working liquid. The vapor flows to the adiabatic portion B of lower vapor pressure from the vaporizing portion A of higher vapor pressure, and then it reaches the condensing portion C through the adiabatic portion B. In the condensing portion C, the vapor is cooled and condensed to radiate the heat of liquefaction. Thus, with the movement of the vapor which has obtained heat of vaporization, the heat from the semiconductor element as a heat generator is transferred in the axial direction of the heat pipe. As the result, the heat is radiated outwards.

The amount of the working liquid in the vaporizing portion A is smaller than the amount of the working liquid in the condensing portion C, since the working liquid is always vaporized in the vaporizing portion A and the working liquid is always condensed in the condensing portion C. Accordingly, the capillary pressure in the condensing portion is higher than the capillary pressure in the vaporizing portion A. Due to the capillary action of the wicking material 2, the working liquid is transported from the condensing portion C to the vaporizing portion A. The working liquid is continuously vaporized and condensed nearly at the same temperature, respectively. The temperature gradient of the heat pipe is very small over the whole length of the heat pipe in the stationary state. A large amount of heat is transferred. The thermal conductivity of the heat pipe is high, or the thermal resistivity is low.

The above-described heat pipe is used to cool electric parts, and particularly electronic parts such as power transistors and diodes in a cooling assembly according to this invention.

Figure 2:
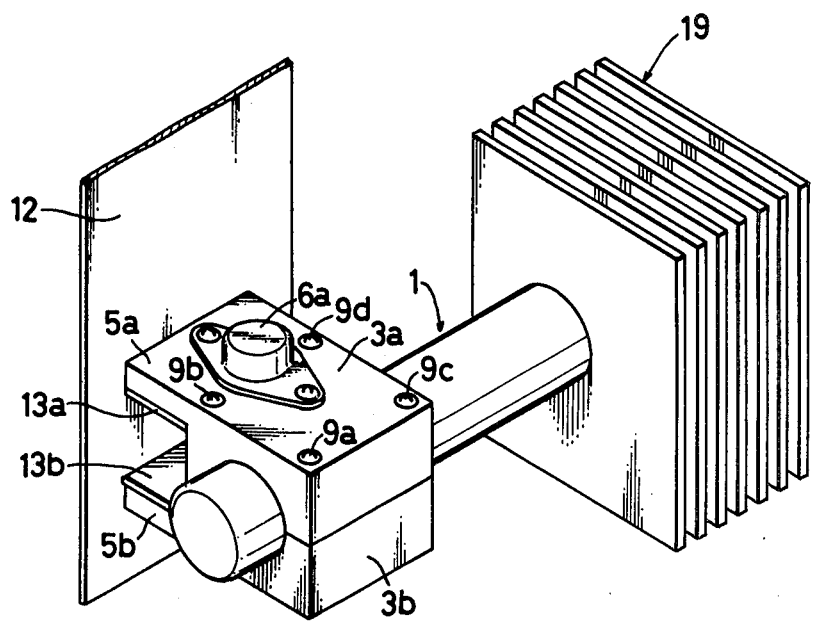
FIG. 2 is a perspective view of a cooling assembly according to a first embodiment of this invention.
Figure 3:
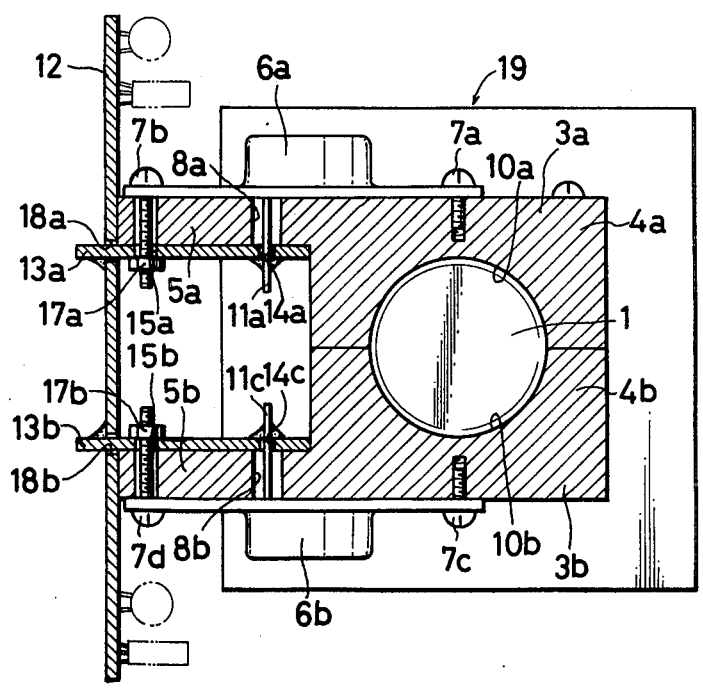
FIG. 3 is a cross sectional view of the cooling assembly of FIG. 2.
Figure 4:
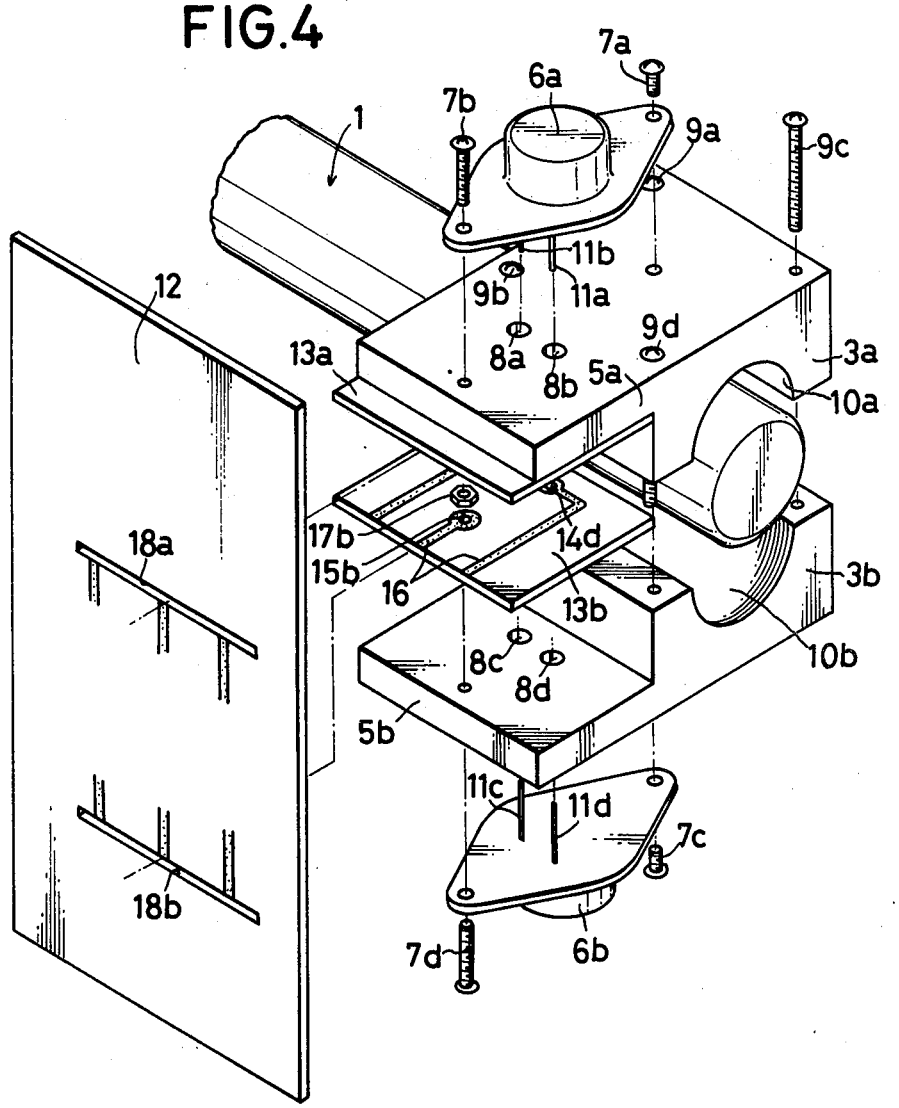
FIG. 4 is an enlarged, exploded perspective view of the cooling assembly of FIG. 2.

A first embodiment of this invention is shown by FIG. 2, FIG. 3 and FIG. 4. A heat-conductive block is constituted by a pair of block members 3a and 3b. Heat is transmitted from electronic parts, namely power transistors 6a and 6b in this embodiment, to the heat pipe 1 through the heat conductive block. As described with reference to FIG. 1, the heat is radiated at the condensing portion of the heat pipe 1. Plural cooling fins 19 constituted by square plates are fixed on the outer surface of the condensing portion of the heat pipe 1 to obtain a higher radiation effect.

Next, the combination of the block members 3a and 3b with the heat pipe 1 and a printed circuit board 12 will be described in more detail with reference to FIG. 3 and FIG. 4. The block members 3a and 3b may be similar to each other in shape. They consist of right parallelpiped, thickened portions 4a and 4b, and plate-like thinned portions 5a and 5b which are made of heat-conductive material such as aluminum, respectively. The thickened portions 4a and 4b are fixed to each other by screws 9a, 9b, 9c and 9d so as to hold the heat pipe 1 at semicylindrical grooves 10a and 10b formed in the centers of the thickened portions 4a and 4b. The power transistors 6a and 6b are fixed on the outer surfaces of the block members 3a and 3b by screws 7a, 7b, 7c and 7d, extending over the thickened portions 4a and 4b, and the thinned portions 5a and 5b. Thermal grease is coated on the contact surfaces of the block members 3a and 3b with power transistors 6a and 6b in order to lower the thermal resistance between the transistors 6a and 6b, and the block members 3a and 3b. The transistors 6a and 6b are arranged on the block members 3a and 3b in such a manner that at least one part of the transistors 6a and 6b are positioned on the thinned portions 5a and 5b. Piercing holes 8a and 8b, and 8c and 8d are made in the thinned portions 5a and 5b, respectively. Leads 11a, 11b, 11c and 11d of the transistors 6a and 6b are led through the piercing holes 8a, 8b, 8c and 8d, respectively. Top portions of the leads 11a, 11b, 11c and 11d are projected from the inner surfaces of the thinned portions 5a and 5b, and they are soldered to connectors 13a and 13b. The connectors 13a and 13b may be small-sized printed circuit boards. In the printed circuit boards, piercing holes 14a, 14b, 14c and 14d for passing the leads 11a, 11b, 11c and 11d, and piercing holes 15a and 15b for passing the screws 7b and 7d to fix the transistors 6a and 6b are made in insulating boards. Writing patterns 16 are printed on the insulating boards for electrically connecting the leads 11a to 11d and the screws 7b and 7d to a printed circuit board 12. The leads 11a to 11d are connected to the connectors 13a and 13b by soldering, while the screws 7b and 7d are fixed to the connectors 13a and 13b by engagement with nuts 17a and 17b.

The connectors 13a and 13b are inserted through oblong holes 18a and 18b made in the printed circuit board 12. As shown in FIG. 3, the wiring patterns 16 are connected to a wiring pattern of the printed circuit board 12 by soldering.

After the electric wiring is completed, the heat pipe 1 is inserted between the semicylindrical grooves 10a and 10b, and the screws 9a, 9b, 9c and 9d are tightened to couple the heat pipe 1 with the thickened portions 4a and 4b. When the heat pipe 1 is to be dismounted from the thickened portions 4a and 4b, the screws 9a, 9b, 9c and 9d are loosened and then the heat pipe 1 is drawn out from the thickened portions 4a and 4b.

Figure 5:
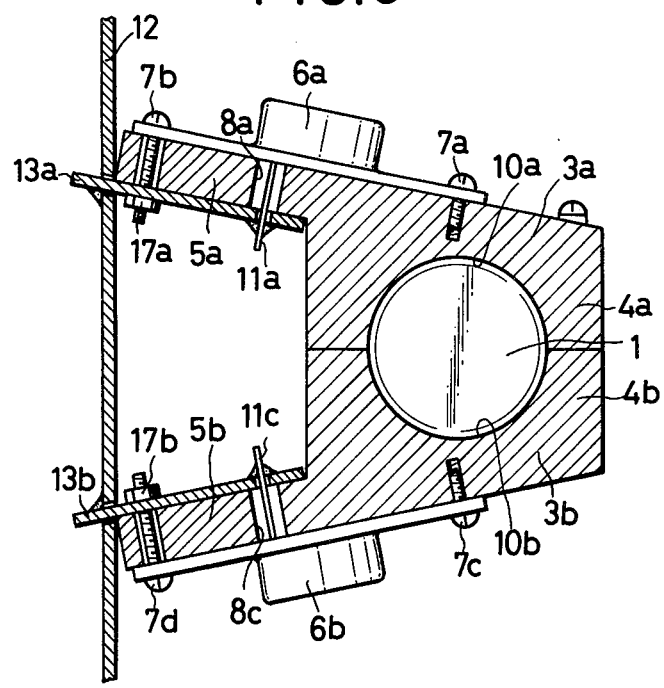
FIG. 5 is a cross sectional view of a cooling assembly according to a second embodiment of this invention.

Next, a second embodiment of this invention will be described with reference to FIG. 5. Parts in FIG. 5 which correspond to the parts in FIG. 1 to FIG. 4 are designated by the same reference numerals.

This embodiment is different from the first embodiment in that the surfaces of the block members 3a and 3b for mounting the transistors 6a and 6b are inclined to the printed circuit board 12, so as to diverge from each other. Because of the inclined surfaces of the block members 3a and 3b, it is easy to use the screw-driving to drive screws 7a, 7b, 7c and 7d. Accordingly, it is easy to mount and demount the transistors 6a and 6b, for example in repairing operation.

According to this invention, the heat transfer means is combined with the electronic parts only through the heat-conductive block in such a manner that the former is inserted through the hole formed in the latter. The cooling assembly is simple in construction. The heat transmission is satisfactory.

Moreover, since the heat generating electronic part is attached to the plate-like thinned portion, it can be fixed on the heat-conductive block in the normal manner. The attaching operation is simple.

Next, a cooling assembly according to a third embodiment of this invention will be described with reference to FIG. 6. Parts in FIG. 6 which correspond to the parts in FIG. 1 to FIG. 4 are designated by the same reference numerals.

This embodiment is different from the first embodiment in the fact that second semicylindrical grooves 27a and 27b are formed besides the first semicylindrical grooves 10a and 10b in the block members 3a and 3b. First and second heat pipes 1a and 1b are aligned with each other in the semicylindrical grooves 10a and 10b, and a third heat pipe 1c is arranged in the semicylindrical grooves 27a and 27b at right angles with the first and second heat pipes 1a and 1b. A higher heat-radiation effect can be obtained by the combination of the pair of block members 3a and 3b with the three heat pipes 1a, 1b and 1c.

Figure 6:
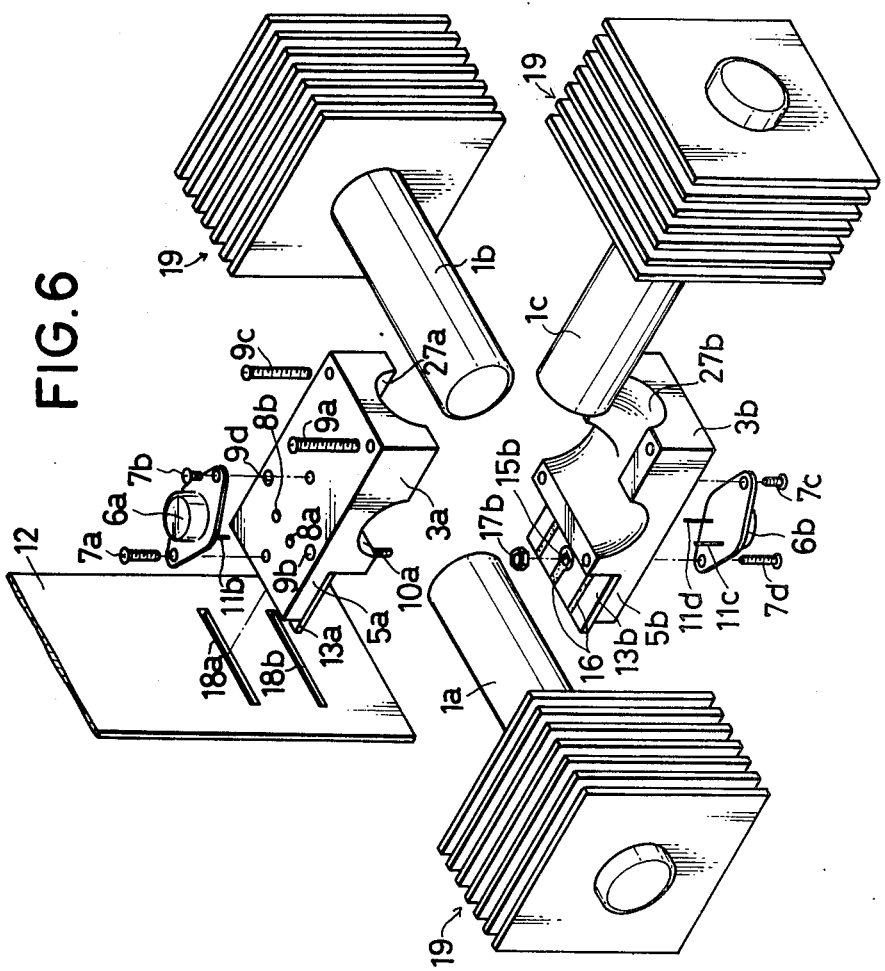
FIG. 6 is an enlarged, exploded perspective view of a cooling assembly according to a third embodiment of this invention.

In the cooling assembly shown in FIG. 6, the shorter heat pipes 1a, 1b and 1c having a larger diameter can be used to increase the heat radiating effect. The heat pipes 1a, 1b and 1c, and the cooling fins 19 may be standardized, and of the same shape. The productivity can be greatly increased, and the manufacturing cost can be lowered.

According to this embodiment, the plural heat pipes are connected to the common heat conductive block at their base ends, and they extend in different directions. The heat from the heat-generating electronic parts is transmitted through the heat pipes in the different directions. Accordingly, the length of the heat pipes can be suitably shortened, and the heat conductivity can be raised. The heat pipes are straight. It is easy to manufacture and handle the heat pipes. The heat is smoothly transferred through the heat pipes.

There is considered a case that two heat pipes with cooling fins are connected in alignment with each other to a heat-conductive block provided with semiconductor elements such as transistors, at their vaporizing portions, and a printed circuit board is connected to the heat-conductive block through connectors, as shown on FIG. 3. In this case, when the width of the printed circuit board is smaller than the distance between the fins fixed on the end of the one heat pipe and the fins fixed on the end of the other heat pipe the system works satisfactorily. However, when the width of the printed circuit board is larger than the distance between the fins fixed on the end of the one heat pipe and the fins fixed on the end of the other heat pipe, there is some trouble in attaching the printed circuit board to the heat conductive block. For example, it is required to increase the length of the thinned portions 5a and 5b of the blocks 3a and 3b shown on FIG. 3. For such requirement, non-standardized blocks must be prepared which is uneconomical.

A cooling assembly to overcome the above described disadvantage, according to a fourth embodiment of this invention, will be described with reference to FIG. 7, FIG. 8 and FIG. 9. Parts in FIG. 7 to FIG. 9 which correspond to the parts in FIG. 1 to FIG. 6 are designated by the same reference numerals, which will not be described.

Figure 7:
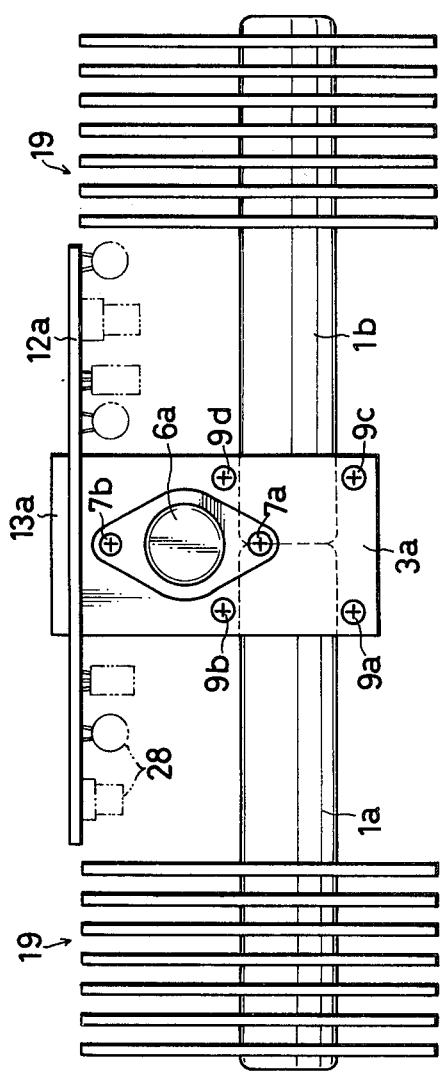
Figure 8:
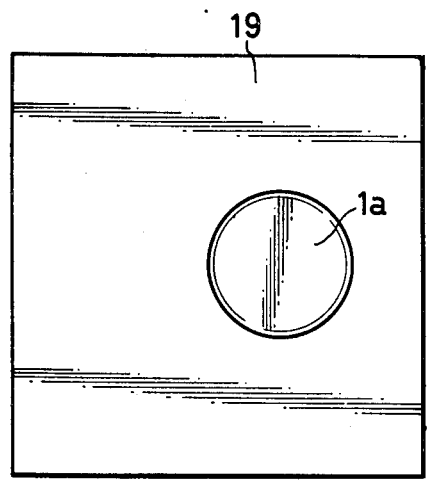
FIG. 8 is a left side view of the cooling assembly of FIG. 7.

Referring to FIG. 7, the heat conductive blocks 3a and 3b shown on FIG. 3 are arranged on the vaporizing portions of the heat pipes 1a and 1b. Cooling fins 19 are fixed on the other ends of the heat pipes 1a and 1b. The heat pipes 1a and 1b are combined eccentrically with the cooling fins 19, as shown on FIG. 8. With such an arrangement, two kinds of printed circuit boards which are different in size can be used.

As shown on FIG. 7, when the width of a printed circuit board 12a is smaller than the distance between the left cooling fins 19 fixed on the end of the heat pipe 1a and the right cooling fins 19 fixed on the end of the heat pipe 1b which is decided by the length of the heat pipes 1a and 1b, and the size of the cooling fins 19, the printed circuit board 12a and the heat-conductive block members 3a and 3b can be arranged within a space defined by the left and right cooling fins 19, as shown on FIG. 7. Such a cooling assembly is superior in space utilization. However, the width of the printed circuit board is limited by the distance between the left and right cooling fins 19.

When the width of the printed circuit board is so large that the printed circuit board cannot be arranged within the space defined by the left and right cooling fins 19, the heat pipes 1a and 1b, and cooling fins 19 fixed on the heat pipes 1a and 1b are rotated around the axis of the heat pipes 1a and 1b by 180° from the position shown on FIG. 7 with respect to the heat conductive block members 3a and 3b, as shown on FIG. 9. In such an arrangement, a printed circuit board 12b is arranged beyond the space defined by the left and right cooling fins 19, so that the width of the printed circuit board 12b is not limited by the distance between the left and right cooling fins 19.

According to this embodiment, there are two ways of combining the heat pipes having the cooling fins, and the heat-conductive block members. It is not required to prepare two kinds of heat pipes having cooling fins, and heat-conductive block members for the two different use conditions. One kind of standardized heat pipes having cooling fins and heat-conductive block members can be used for the two different conditions.

The eccentricity of the central axis X of the heat pipes with the cooling fins (circular or square) should be selected so that the heat pipes having the cooling fins and the heat conductive block members can be used for the two different conditions.

The eccentricity of the central axis X of the heat pipes is expressed by $(L_1 - L_2)/2$, where $L_1$ represents the distance between the remote end of the cooling fins 19 and the central axis X, and $L_2$ respresents the distance between the near end of the cooling fins 19 and the central axis X. When electronic parts 28 are attached to the inner surface of the printed circuit board, facing toward the heat pipes, the eccentricity must be larger than half of the height of the highest of the electronic parts 28. Accordingly, the difference $(L_1 - L_2)$ may be about 20 to 80 mm, and preferably 40 to 50 mm. When the distance between the central axis X and the printed circuit board is represented by $L_3$, it is preferable that $L_1$ be nearly equal to $L_3$, or that $L_1$ be slightly larger than $L_3$. It is preferable that $L_1$ be larger at least by the sum of the height of the highest of the electronic parts 28 and the thickness of the printed circuit board than $L_2$. Accordingly, $L_1$ may be larger preferably by about 20 to 80 mm than $L_2$, and preferably by about 40 to 50 mm. The sum of $(L_1 + L_2)$ is normally about 50 to 100 mm. The height of the highest of the electronic parts 28 is normally about 40 to 50 mm. Accordingly, $L_2/L_1$ is normally $\frac{1}{3}$ or less than $\frac{1}{3}$, and preferably $\frac{1}{2}$ or less than $\frac{1}{2}$.

In this embodiment, the heat pipes are combined eccentrically with the cooling fins. The heat pipes and cooling fins, and the heat-conductive block members can be standardized for the different use conditions.

In the above-described embodiments, the connectors 13a and 13b are electrically connected to the printed circuit board 12 in such a manner that the connectors 13a and 13b are inserted through the oblong holes 18a and 18b made in the printed circuit board 12 and then the connectors 13a and 13b are soldered to the printed circuit board 12. However, a plug-socket type connector may be attached to the printed circuit board 12. In that case, the connectors 13a and 13b are inserted into the plug-socket type connector to be electrically connected to the printed circuit board 12.

The wiring patterns 16 may be formed comb-like and projected from the edges of the connectors 13a and 13b, and plural small holes may be made in the printed circuit board, instead of the oblong holes 18a and 18b. In that case, the projected wiring patterns 16 are inserted through the small holes, respectively, and soldered to the printed circuit board.

In the above-described embodiments, the connectors 13a and 13b are separated from each other. However, a connector block 20 as one body may be used instead of the connectors 13a and 13b, as shown on FIG. 10A and FIG. 10B. Holes 21a and 21b are formed for inserting the leads 11a and 11b of the transistor 6a in the connector block 20. A screw hole 22a is formed for engaging with the screw 7b in the connector block 20. Opposite to the holes 21a and 21b, and the screw holes 22, other holes 21c and 21d and screw hole 22b are formed for inserting the leads 11c and 11d of the transistor 6b, and for engaging with the screw 7d in the connector block 20. As shown on FIG. 10B, the holes 21a to 21d are defined by sleeves 25a and 25d, and the screw holes 22a and 22b are defined by the screw cylinders 26a and 26b, respectively. The sleeves 25a to 25d are combined with leads 23a, 23c, 24a and 24c so as to form one L-shaped body, respectively. And the screw cylinders 26a and 26b are combined with leads 23b and 24b so as to form one L-shaped body, respectively. The L-shaped bodies of the sleeves 25a to 25d, the screw cylinders 26a and 26b and the leads 23a to 23c and 24 a to 24c are embedded in one mold formed of insulating material. Thus, the connector block 20 is produced. As shown by FIG. 10A, the leads 23a to 23c and 24a to 24c are projected from the surface of the connector block 20. The projected leads 23a to 23c and 24a to 24c are electrically connected to the printed circuit board.

The connector block 20 shown on FIG. 10A and FIG. 10B is so designed as to be combined with the heat-conductive block members 3a and 3b according to the first embodiment shown on FIG. 3. A trapezoidal connector block is combined with the heat conductive block members 3a and 3b according to the second embodiment shown on FIG. 5.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims.

What is claimed is:

1. In a cooling assembly including a heat generating electric part having leads, a heat conductive block mounting said heat generating electric part, and a heat pipe attached to said heat conductive block for radiating the heat from said heat generating electric part to the air through said heat conductive block, the improvement in which said heat-conductive block comprises a thickened portion combined with said heat pipe, and a thinned portion having two sides formed contiguously to said thickened portion, said heat generating electric part is mounted on said heat-conductive block so that at least one part of said heat generating electric part extends on one side of said thinned portion, and a connector is arranged on the other side of said thinned portion and connected to said leads of the heat generating electric part, in which said heat conductive block comprises first and second block members having thickened portions and thinned portions, grooves conforming with the shape of said heat pipe are made in said thickened portions, and said heat pipe is held between said grooves, in which said thinned portions of the heat conductive block are opposed to each other, extending obliquely from said thickened portions, so as to diverge from each other.

2. A cooling assembly according to claim 1, in which holes for inserting said leads of the heat generating electric part are made in said thinned portion of the heat conductive block, and said thinned portion includes means for attaching said heat generating electric part and said connector.

3. A cooling assembly according to claim 1, further comprising a printed circuit board substantially perpendicular to said connector, the wiring pattern of said printed circuit board being connected to the leads arranged on said connector.

4. A cooling assembly according to claim 1, in which said heat conductive block comprises first and second block members having thickened portions and thinned portions, grooves conforming with the shape of said heat pipe are made in said thickened portions, and said heat pipe is held between said grooves.

5. A cooling assembly according to claim 4, in which said thinned portions of the first and second block members are opposed to each other, and said connector comprises first and second connector members arranged on the opposed surfaces of said thinned portions.

6. A cooling assembly according to claim 4, in which said thinned portions of the first and second block members are opposed to each other, and said connector is arranged between the opposed surfaces of said thinned portions.

7. A cooling assembly according to claim 4, in which second grooves conforming with the shape of a second heat pipe are made in said thickened portions substantially in perpendicular to said first-mentioned grooves, and a second heat pipe is held between said second grooves.

8. A cooling assembly according to claim 1, in which cooling fins are attached to one end of said heat pipe remote from said heat conductive block, said cooling fins being concentric with the axis of said heat pipe.

* * * * *